United States Patent [19]

Parent et al.

[11] 4,199,480

[45] Apr. 22, 1980

[54] ELECTRICALLY CONDUCTIVE BOAT FOR VACUUM EVAPORATION OF METALS

[75] Inventors: Edward D. Parent, Hamilton, Mass.; Thomas B. McDonough, San Jose, Calif.

[73] Assignee: GTE Sylvania Incorporated, Stamford, Conn.

[21] Appl. No.: 909,851

[22] Filed: May 25, 1978

[51] Int. Cl.$^2$ .............................................. H01B 1/04
[52] U.S. Cl. ...................................... 252/516; 106/44
[58] Field of Search ........................... 252/516; 106/44

[56] References Cited

U.S. PATENT DOCUMENTS

| | | | |
|---|---|---|---|
| 3,181,968 | 5/1965 | Mandorf, Jr. | 427/47 X |
| 3,256,103 | 6/1966 | Roche, Jr. et al. | 252/520 X |
| 3,544,486 | 12/1970 | Passmore | 427/50 |
| 3,813,252 | 5/1974 | Lipp | 427/12 X |
| 3,915,900 | 10/1975 | Reinmuth et al. | 252/520 |

*Primary Examiner*—E. Suzanne Parr
*Attorney, Agent, or Firm*—James Theodosopoulos

[57] ABSTRACT

An electrically conductive boat for the vacuum evaporation of metals comprises a refractory composition consisting essentially of a conductor of titanium diboride and/or zirconium diboride, a coconductor of silicon carbide and an insulator of boron nitride.

3 Claims, No Drawings

ELECTRICALLY CONDUCTIVE BOAT FOR VACUUM EVAPORATION OF METALS

THE INVENTION

This invention is concerned with electrically conductive boats of refractory composition for use in the vacuum evaporation of metals. Examples of such boats are shown in U.S. Pat. Nos. 3,915,900, 3,813,252, 3,544,486, 3,452,970, 3,344,505, 3,291,662, 3,256,103, 3,236,663, 3,181,968, and 2,984,807. In such boats titanium diboride is the electrically conductive material that is generally used, along with an insulative material, generally boron nitride, which imparts machineability and is resistant to molten metals such as aluminum.

In such boats it is desirable that the curve of resistivity versus temperature be substantially flat over the operating temperature range of the boat, because such a flat curve aids in maintaining a balanced operation during a continuous evaporation operation, for example, where aluminum wire on a spool is unreeled and fed into a boat where it is evaporated and deposited on plastic film being unwound from one roll and taken up on another.

This invention discloses an electrically conductive evaporating boat in which the curve of resistivity versus temperature is generally flatter than that of prior art boats. The boat composition consists essentially of a conductor, titanium diboride and/or zirconium diboride, a coconductor, silicon carbide, with the balance being boron nitride. The composition may include, if desired, a small amount of flux such as boron oxide. In order to attain the desired resistivity versus temperature curve, the composition should be about 15% to 35% by weight silicon carbide, 35% to 60% by weight titanium diboride and/or zirconium diboride, with boron nitride making up the balance. In a specific example, 3423 grams (equivalent to 50 weight %) of titanium diboride, 1348 grams (19.7 weight %) of silicon carbide, 1958 grams (28.6 weight %) of boron nitride and 116 grams (1.7 weight %) of boric oxide powders were thoroughly blended and then vacuum hot pressed into a dense billet from which evaporating boats were machined. The resistivity of these boats measured at room temperature was 1400 microohm centimeters. Over the operating temperature range of 800° to 1800° C., the resistivity varied from 2950 to 3075 microohm centimeters, a variation of only 4%. In contrast, two prior art compositions measured over the same operating temperature range showed resistivity variations of 35% and 11%.

We claim:

1. An electrically conductive boat for the vacuum evaporation of metals comprising a refractory composition consisting essentially of a conductor of titanium diboride and/or zirconium diboride, a coconductor of silicon carbide, and an insulator of boron nitride, the weight percent of the conductor is about 35% to 60% and the weight percent of the silicon carbide is about 15% to 35%, the balance being boron nitride.

2. The boat of claim 1 wherein the composition includes a small amount of flux material.

3. The boat of claim 1 wherein the composition comprises about 50% by weight of titanium diboride, about 19.7% of silicon carbide, about 28.6% of boron nitride and about 1.7% of boric oxide.

* * * * *